(12) United States Patent
Lee et al.

(10) Patent No.: US 6,483,038 B2
(45) Date of Patent: Nov. 19, 2002

(54) MEMORY CARD

(75) Inventors: Joon-ki Lee, Seoul (KR); Woong-ky Ha, Kyunggi-do (KR); Young-Hee Song, Kyunggi-do (KR); Young-shin Kwon, Chungcheongnam-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/865,045

(22) Filed: May 23, 2001

(65) Prior Publication Data

US 2002/0020911 A1 Feb. 21, 2002

(30) Foreign Application Priority Data

May 23, 2000 (KR) .......................................... 00-27743

(51) Int. Cl.7 ................................................ H05K 1/03
(52) U.S. Cl. ...................... 174/255; 361/684; 361/737; 439/946
(58) Field of Search ................................ 361/684, 737; 174/255; 439/946; 257/679

(56) References Cited

U.S. PATENT DOCUMENTS

| | | | | |
|---|---|---|---|---|
| 4,924,076 A | * | 5/1990 | Kitamura .................... | 361/684 |
| 5,627,729 A | * | 5/1997 | Olendorf et al. ............ | 361/737 |
| 6,028,774 A | * | 2/2000 | Shin et al. ................... | 361/737 |
| 6,085,412 A | * | 7/2000 | Iwasaki ........................ | 29/827 |
| 6,169,325 B1 | * | 1/2001 | Azuma et al. .............. | 257/685 |

* cited by examiner

Primary Examiner—Albert W. Paladini
(74) Attorney, Agent, or Firm—Marger Johnson & McCollom, P.C.

(57) ABSTRACT

The present invention provides a memory card having a reduced size as much as that of the package. The memory card includes electrical contact pads disposed in a single row on one end of the memory card. The memory card further comprises a card base and a semiconductor package. The card base has a first surface and a second surface, the first surface having a cavity formed thereon. The semiconductor package comprises a substrate, memory chips, and a molding resin layer, and is mounted on the cavity so that the external contact pads are exposed. Circuit wirings are formed on an inner surface of the substrate and electrically connected to the external contact pads that are formed on an outer surface of the substrate.

16 Claims, 7 Drawing Sheets

MEMORY CARD

This application relies for priority upon Korean Patent Application No. 2000-27743, filed on May 23, 2000, the contents of which are herein incorporated by reference in their entirety.

BACKGROUND OF THE INVENTION

1. Field of the Invention

The present invention relates to a semiconductor device, and more particularly to a very small-sized memory card for storing and retrieving data for digital products.

2. Description of the Related Arts

Recently, various digital products such as MP3 phones, MP3 players, or digital cameras have been developed and becoming widely used. These digital products use a memory card to store and retrieve data. The memory card typically employs flash memory chips, newly introduced as storage media.

FIGS. 1 and 2 show a conventional memory card 10, where a semiconductor package 20 is contained in a plastic card base 30, a "base card". The semiconductor package 20 is a COB (chip on board) package. The package 20 is physically attached to the card base 30 with a double-sided adhesive tape 32.

The memory card 10 is inserted into the digital products (not shown). A plurality of external contact pads 26 exposed on the surface of the memory card 10 are connected to the digital products to provide electrical connection between the memory chip 10 and the digital products. Because the external contact pads 26 are exposed on the outside of the memory card 10, the external contact pads 26 can be easily contaminated by dust or other contaminants during the actual usage. Therefore, the memory card 10 needs a holding portion 12 to be grasped by the user. However, this increases the size of the memory card 10. The external contact pads 26 are not formed on the holding portion 12.

The memory card 10 has a size of approximately twice the total dimension of the external contact pads. For example, the size of the conventional memory card 10 is approximately 37 mm×45 mm. The size of the memory card prevents the miniaturization of digital products using the memory card 10, and further limits the development of portable electronic appliances such as a hand-held computer or a cellular phone.

The conventional memory card 10 is very thin, i.e. approximately 0.76 mm. This makes it difficult to mount the memory chip inside of the package 20. Further, it results in poor warpage resistance, and damage to the memory chip mounted within the package 20. Moreover, insertion or removal of the memory card 10 in and out of the digital products has been cumbersome, and the use of the memory card 10 has been restricted due to the poor thermal resistance thereof.

Further, the conventional memory card 10 has another problem in forming the molding resin layer 24 shown in FIG. 2. In particular, as illustrated in FIG. 3A, for forming the COB package 20, a memory chip 28 is mounted on a substrate 22 to be sealed by a molding resin 24. The molding resin layer 24 for hermetically sealing and protecting the memory chip 28 is generally formed by a molding method using a mold 40 shown in FIG. 3A. The substrate 22 with the memory chip 28 is placed in the mold 40. Then, a liquid molding resin is injected into the mold 40 and cured. Accordingly, as shown in FIG. 3B, the molding resin layer 24 is formed. Then, molding resin residue 46 on a gate 44 is removed. However, it is not easy to thoroughly remove the molding resin residue 46 due to strong adhesion between the molding resin 42 and the substrate 22.

In order to solve the above-stated conventional problem, as shown in FIG. 3C, in U.S. Pat. No. 5,780,933 and U.S. Pat. No. 6,022,763, a plating layer 48 is formed on the substrate 22 in a predetermined area. By using the plating layer 48, the molding resin residue 46 can be easily removed from the substrate 22 compared to the conventional methods. However, even with this method, the molding resin residue 46 still remains. The remaining molding resin residue 46 prevents the adhesion between the card base 30 and the package 20.

Accordingly, there is a need to develop a new memory card and a semiconductor package structure and method of manufacturing thereof to overcome these problems.

SUMMARY OF THE INVENTION

Accordingly, an object of the present invention is to provide a memory card having a reduced size enough to realize the miniaturization of the digital products.

Another object of the present invention is to provide a memory card having new types of external contact pads for preventing the contamination.

Still another object of the present invention is to handle the memory card easily and improve its reliability.

Further, another object of the present invention is to form the molding resin layer, on which the molding resin residue does not affect the adhesion between the card base and the package.

In order to achieve the foregoing and other objects, the present invention provides a memory card having a reduced size to that of the package, the memory card comprising the electrical contact pads formed on one end in a single row.

The memory card of the present invention comprises a card base and a semiconductor package. The card base comprises a first surface and a second surface, the first surface having a cavity formed thereon. The semiconductor package comprises a substrate, memory chips, and a molding resin layer, and is mounted on the cavity so that the external contact pads are exposed. Circuit wirings are formed on an inner surface of the substrate and the external contact pads electrically connected to the circuit wirings are formed on an outer surface of the substrate. The memory chips mounted on said substrate, and the memory chips are connected to the circuit wirings by an electrical connection means. The molding resin layer hermetically seals the memory chips and the electrical connection means.

Preferably, a slot is formed on the second surface of the card base, and the semiconductor package is mechanically attached to the cavity by a liquid adhesive. The memory chip is NAND-type or NOR-type flash memory chip, and the electrical connection means between the memory chip and the circuit wirings is selected from the group consisting of a metal wire, a TAB tape and an anisotropic conductive film (ACF). It is preferable that the molding resin layer is asymmetrically formed so that the molding resin layer is biased to an edge opposite to the edge on which the external contact pads are formed, and that the molding resin layer comprises a notch corresponding to a gate. The notch indents into the molding resin layer horizontally from an edge of the molding resin layer and downwardly from a top surface of the molding resin layer

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 4:
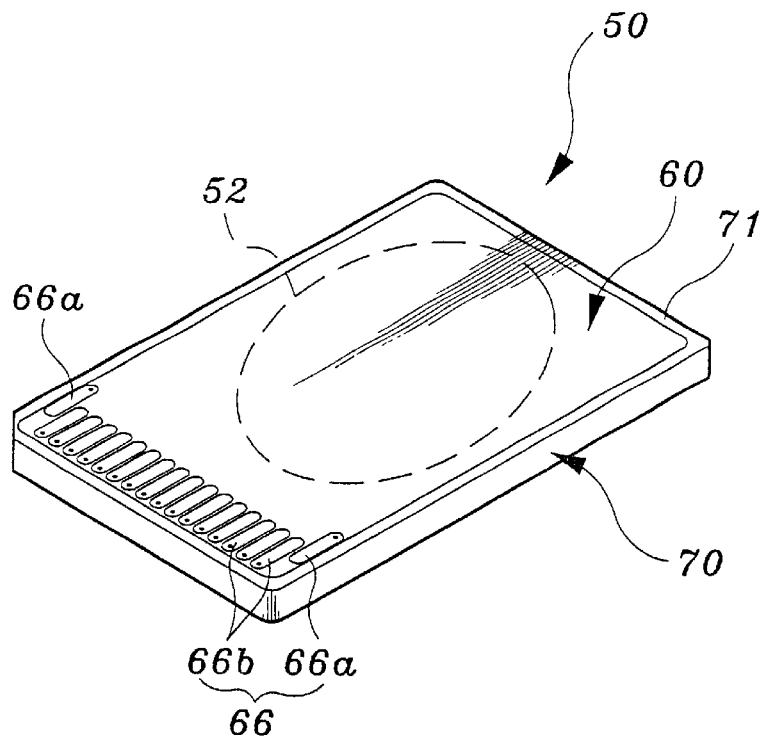
FIG. 4 is a perspective view of a memory card in accordance with an embodiment of the present invention.
Figure 5:
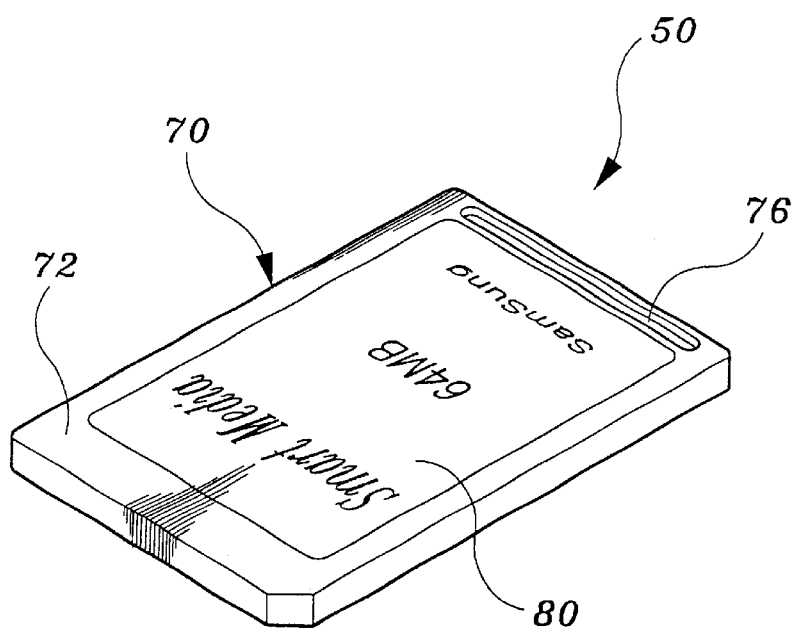
FIG. 5 is a perspective bottom view of the memory card.
Figure 6:
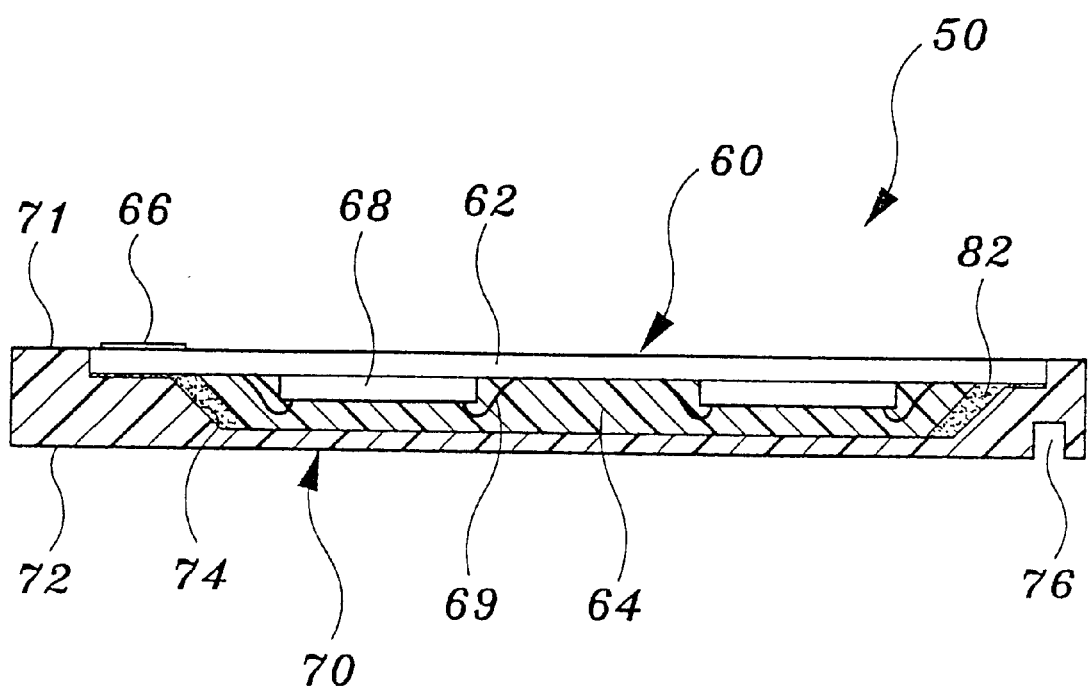
FIG. 6 is a cross-sectional view of the memory card.

FIGS. 4, 5 and 6 show a memory card 50 in accordance with preferred embodiments of the present invention. The memory card 50 comprises a plastic card base 70 and a semiconductor package 60 inserted into the card base 70. The card base 70 comprises a first surface 71, and a second surface 72 to which a label 80 is attached. External contact pads 66 are formed on an outer surface of a substrate 62 that forms the package 60. FIG. 4 and FIG. 5 show the first surface 71 and the second surface 72 of the card base 70, respectively. FIG. 6 shows a cross-sectional view of the memory card 50.

With reference to FIG. 6, the package 60 is attached to the first surface 71 of the card base 70. A cavity 74 (FIG. 6) for receiving the package 60 is formed on the first surface 71 of the card base 70. The package 60 has almost the same size as that of the card base 70. That is, the size of the memory card 50 is reduced to that of the package 60. In this embodiment, the memory card 50 has a size of approximately 22 mm×30 mm and a thickness of approximately 1.2 mm. The package 60 has a size of approximately 20 mm×28 mm. To realize this, the external contact pads 66 are formed by using a method that is different from the conventional method. The external contact pads 66 are disposed on only one end of the memory card 50. In addition, each of the external contact pads 66 has a substantially rod shape.

Figure 1:
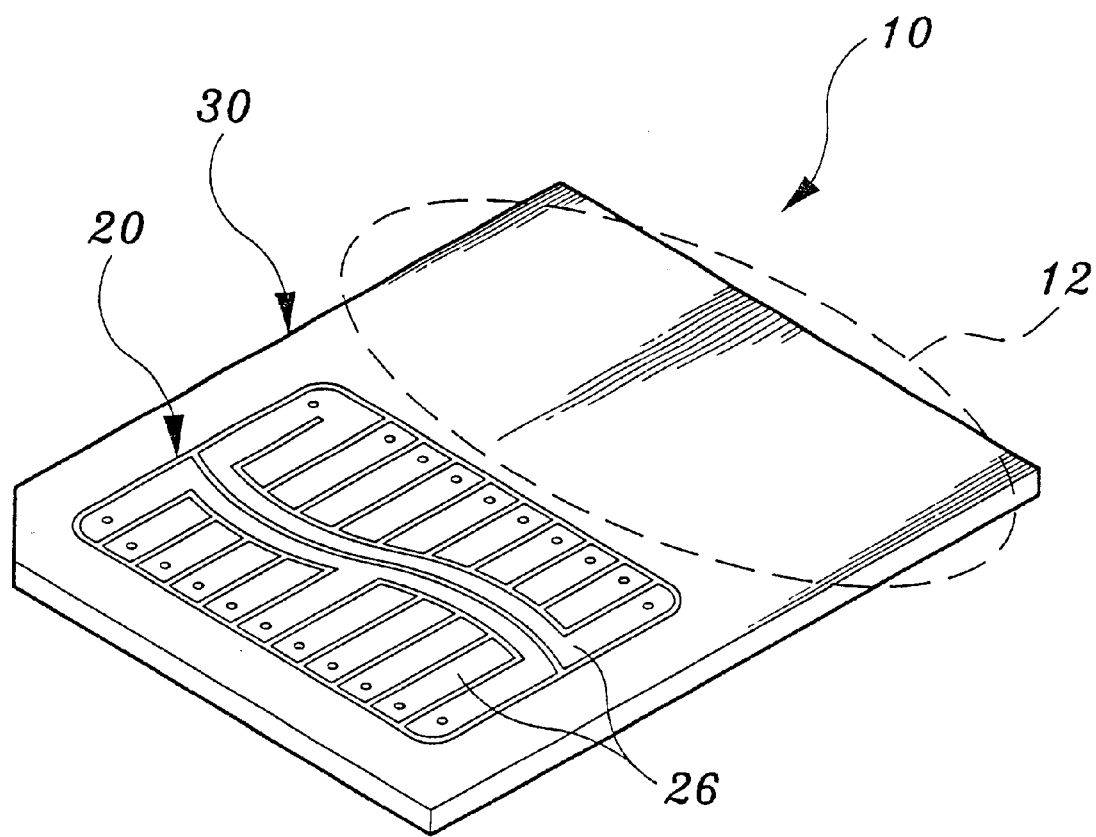
FIG. 1 is a perspective view of a conventional memory card.

In the conventional memory card 10 of FIG. 1, the external contact pads 26 are twenty two (22) pins and are disposed in two rows, each row having eleven (11) pins. The external contact pad 26 has a width of approximately 2 mm and a pitch between the adjacent external contact pads 26 is of approximately 2.5 mm. The external contact pads 26 are formed on the surface of the package 20. Therefore, in order to protect the external contact pads 26 from contamination by the user's handling, the memory card 10 is twice the size of the package 20 and the total dimension of the external contact pads 26 has approximately 50% of the size of the memory card 10.

In contrast, according to the preferred embodiment of the present invention, the external contact pads 66 (having a rod shape) of FIG. 4 comprise a total of eighteen (18) pins including one (1) pin combining a Vcc pin and a Vss pin. Each of the external contact pads 66 has a width of approximately 0.85 mm and a pitch between the neighboring external contact pads 26 of approximately 1.10 mm. An outmost external contact pad 66a has a length of approximately 0.5 mm, and each of the other external contact pads 66b has a length of approximately 0.32 mm. Therefore, the external contact pads 66 can be formed on one end of the package 60, and a holding portion 52 for the user's handling is obtained within the package 60. Accordingly, the size of the memory card 50 of the present invention is reduced to that of the package 60. The total dimension of the external contact pads 66 is no more than 15% of the size of the memory card 50. The outmost external contact pads 66a differ in alignment from external contact pads 66b. This prevents data loss by modifying the order of supplying the voltage, when inserting and removing the memory card 50 in and out of the digital products.

As shown in FIG. 5, a label 80 is attached to the second surface 72 of the card base 70 and a slot is formed through the second surface 72 on one end. The memory card 50 according to the preferred embodiment of the present invention is approximately half the size of the conventional memory card 10 (FIG. 1). Due to the reduced size of the memory card 50, it is inconvenient for users to insert and remove the memory card 50 in and out of the digital products. To deal with this problem, the slot 76 is formed to easily handle the memory card 50. The label 80 shows the product name, the memory capacity and so on.

Again referring to FIG. 6, as stated above, the cavity 74 for receiving the package 60 is formed on the first surface 71 of the card base 70. The package 60 is mounted within the cavity 74 and attached to the card base 70 by conventional techniques such as using a liquid adhesive 82. The package 60 is preferably a Chip on Board (COB) package. In the COB package, the memory chips 68 are mounted on the substrate 62 and the molding resin 64 encapsulates the memory chips 68. The memory chips 68 are electrically connected to the circuit wirings (not shown) formed on the substrate 62 by conventional techniques such as metal wires 69 as described below. The memory chips 68, the circuit wirings, and the metal wires 69 are sealed with the molding resin 64 for protection thereof. The circuit wirings are electrically connected to the external contact pads 66 by via holes (not shown).

The card base 70 is preferably made of polycarbonate having excellent thermal resistance, and the substrate 62 of the package 60 is preferably made of an insulating material such as BT resin (Bismaleimide Triazine Resin) or glass-epoxy resin. The molding resin layer 64 is preferably made of epoxy molding compounds. The circuit wirings and the external contact pads 66 are preferably copper patterns plated with nickel or gold. However, any suitable conductive material can be used in place. The memory chip 68 is preferably a NAND-type or a NOR-type flash memory chip. One or two of the memory chips 68 are contained within a single package 60. If necessary, other devices such as a capacitor or a controller may be additionally included.

Figure 2:
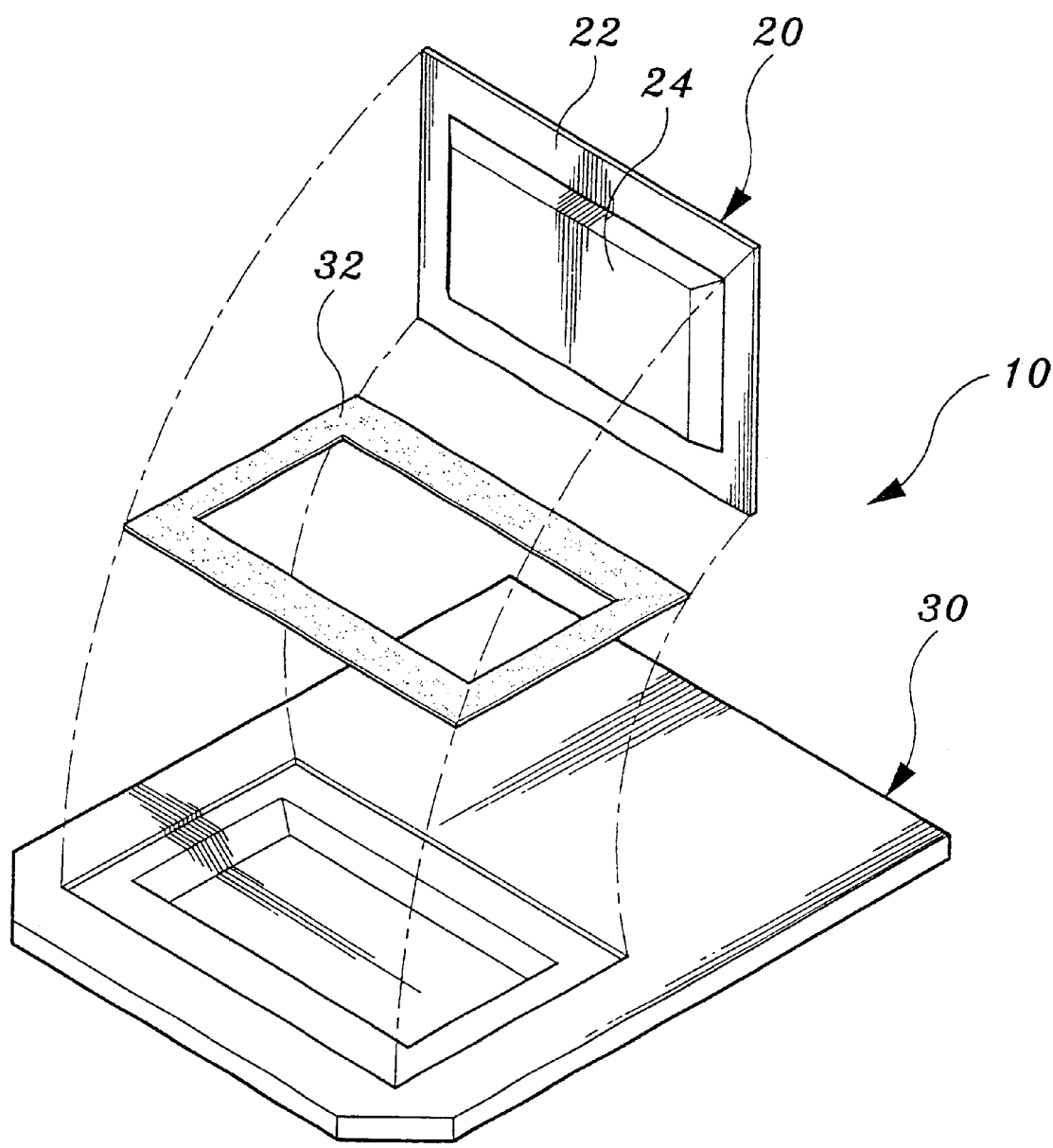
FIG. 2 is an exploded perspective view of the memory card of FIG. 1.

The package 60 may be attached to the card base 70 with the conventional double-sided adhesive tape 32 (FIG. 2) being disposed therebetween. However, this embodiment of the present invention supplies a liquid adhesive 82 in the cavity to increase the attachment dimension and effectively improve the adhesive strength. For electrical connection between the memory chip 68 and the substrate 62, instead of a wire bonding method using the metal wires 69, a TAB (Tape Automated Bonding) method using the tape wiring board on which copper wirings are formed on the insulating tape or a method using an ACF (An-Isotropic Conductive Film) on which conductive particles are dispersed in the resin may be alternatively used.

This embodiment of the present invention uses an un-centered molding method. In the un-centered molding method, the molding resin layer 64 is asymmetrically formed on the center of the substrate 62 but biased toward a direction opposite to the external contact pads 66, i.e.(to the right in FIG. 6). This method has an advantage in that the formation of the molding resin layer 64 does not affect the external contact pads 66. With this method, the direction of the substrate 62, i.e. upper, lower, right and left, may be easily sensed during the manufacturing process, thereby preventing the alignment failure.

Figure 3A:
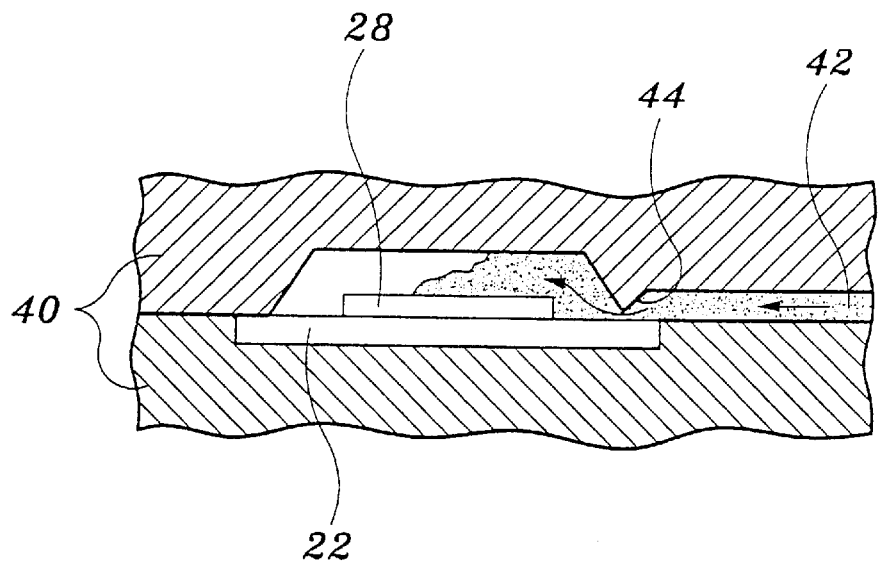
FIGS. 3A, 3B, 3C and 3D are cross-sectional views, each showing a COB (chip-on-board) package employed in the conventional memory card.
Figure 3B:
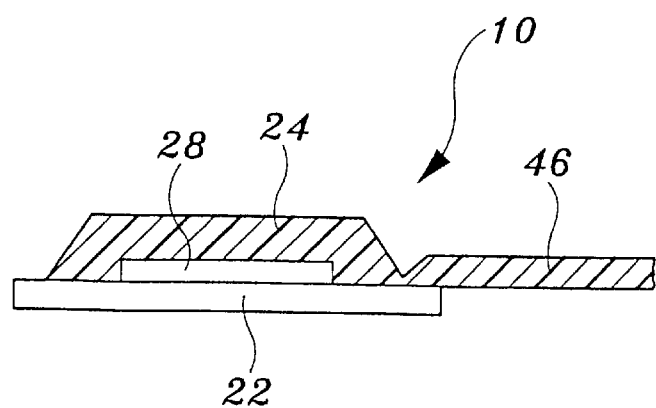
Figure 3C:
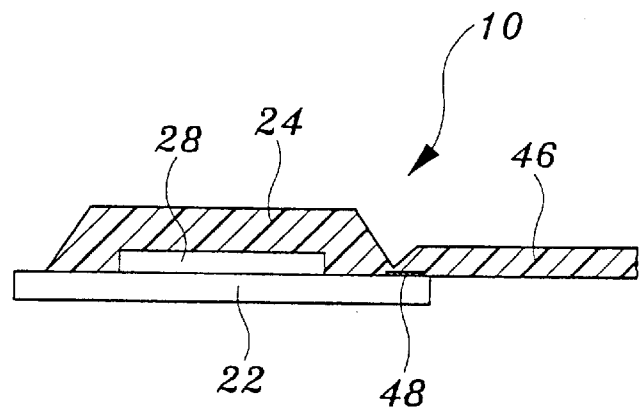
Figure 3D:
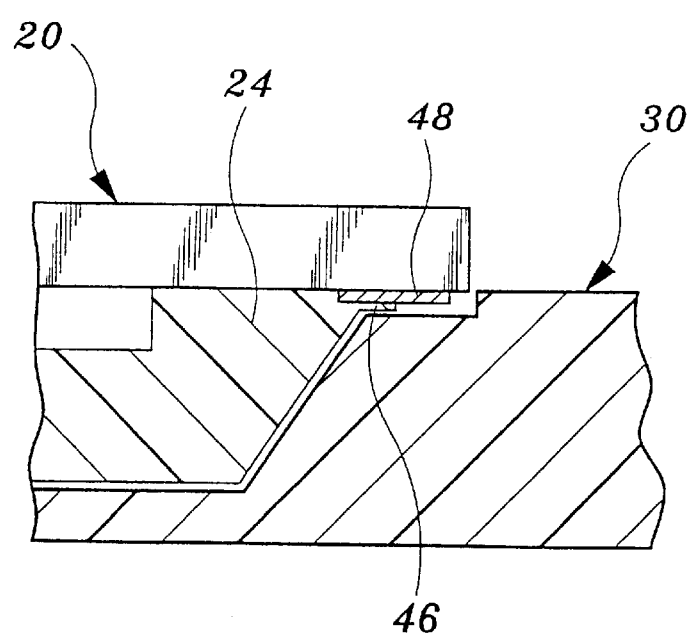
Figure 7A:
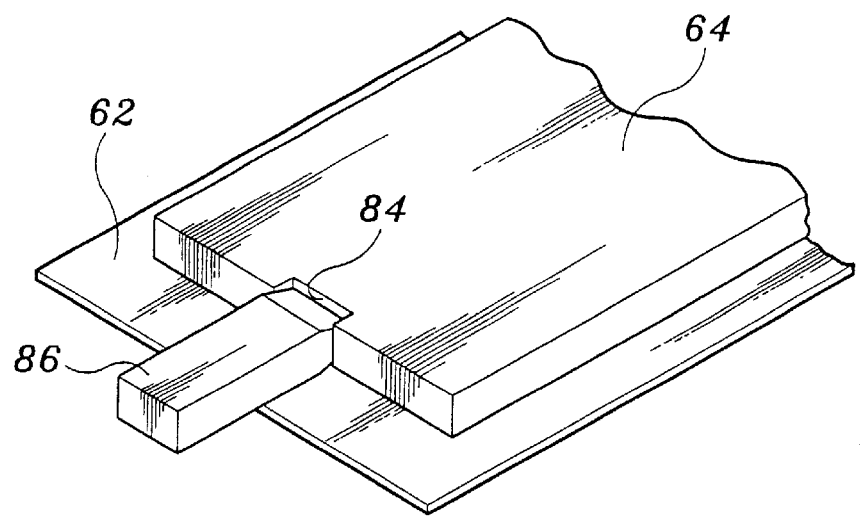
FIGS. 7A and 7B are perspective views, each showing a COB package employed in the memory card of the embodiment of the present invention.
Figure 7B:
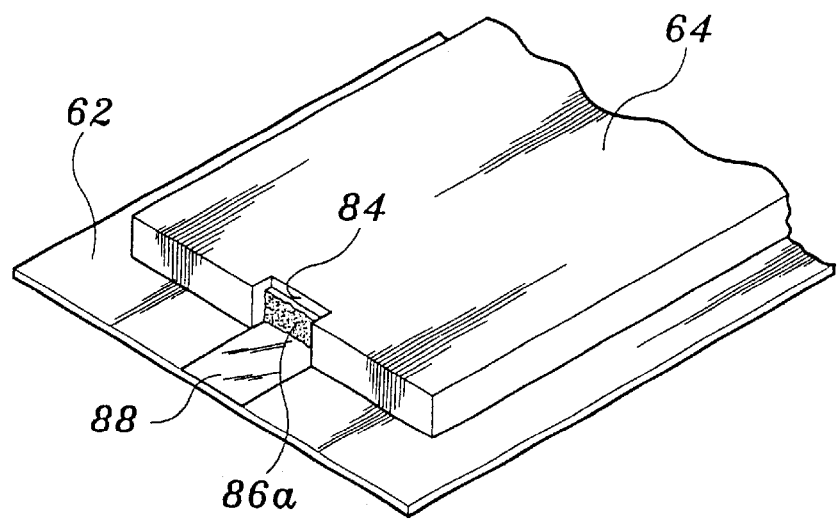

As discussed above in connection with FIGS. 3A to 3D, in the conventional method, after forming the molding resin layer 24, the molding resin residue 46 is not easily removed and, thus, the molding resin residue 46 can prevent the adhesion between the card base 30 and the package 20. In order to solve this problem, as shown in FIG. 7A, a notch 84 is formed on the molding resin layer 64. The notch 84 formed in the molding resin layer 64 corresponds to a mold gate (similar to the gate 44 in FIG. 3A), and indents into the molding resin layer 64 medially (horizontally) from an edge of the molding resin layer 64 and downwardly (vertically) from a top surface of the molding resin layer 64. A molding resin residue 86 is formed on the notch 84. Therefore, as shown in FIG. 7B, although a small extent 86a of the molding resin residue 86 remains on the molding resin layer 64 after removal of the molding resin residue 86, the small extent 86a is disposed within the notch 84 as shown. Thus it does not prevent adhesion between the card base and the package. A reference numeral 88 in FIG. 7B represents a plating layer formed on the substrate 62.

Accordingly, the present invention provides a memory card with a reduced size as much as that of the package by modifying the external contact pads and their alignment. This allows the miniaturization of digital products. Since each external contact pad is significantly reduced in size, the contamination of the memory card due to the user's handling can be prevented. A slot, which is formed in a face of the card base, makes the handling of the small-sized memory card easily. Further, the base card has a thickness enough to mount the memory chip therein. So, the package including the memory chip is easily assembled. And the warpage resistance and the reliability of the memory card are effectively improved.

Because the memory card of the present invention uses the package having a notch in the molding resin layer, although the molding resin residue is still left on the molding resin layer, the remaining molding resin residue does not prevent the adhesion between the card base and the package. Further, the asymmetric molding resin layer does not affect the external contact pads and prevents the alignment failures by easily sensing the direction of the substrate.

Although preferred embodiments of the present invention have been described in detail, it should be understood that many variations and/or modifications of the basic inventive concepts herein taught which may appear to those skilled in the art will still fall within the spirit and scope of the present invention as defined in the appended claims.

What is claimed is:

1. A memory card, comprising:
a card base; and
a semiconductor package,
wherein the card base includes a first surface and a second surface, said first surface having a cavity formed thereon, and
wherein the semiconductor package comprises:
a substrate on which circuit wirings are formed on an inner surface thereof;
a plurality of external contact pads formed on an outer surface of said substrate, the external contact pads electrically connected to the circuit wirings,
one or more memory chips mounted on the inner surface of said substrate, and electrically connected to the circuit wirings; and
a molding resin layer for sealing the memory chips,
wherein the semiconductor package is mounted within the cavity so that the external contact pads are exposed, and substantially all of the external contacts pads being disposed in a single row on one end of the memory card.

2. The memory card of claim 1, wherein each of the external contact pads has a substantially rod shape.

3. The memory card of claim 2, wherein each of the external contact pads has a width of approximately 0.85 mm and a pin pitch of approximately 1.10 mm.

4. The memory card of claim 1, wherein the card base has substantially the same size as that of the semiconductor package.

5. The memory card of claim 1, wherein the total dimension of the external contact pads is approximately no more than 15% of the size of the memory card.

6. The memory card of claim 1, wherein the memory card has a size of approximately 22 mm × 30 mm and a thickness of approximately 1.2 mm.

7. The memory card of claim 6, wherein the semiconductor package has a size of approximately 20 mm × 28 mm.

8. The memory card of claim 1, wherein a slot is formed on the second surface of the card base.

9. The memory card of claim 1, wherein the one or more memory chips are a NAND-type or a NOR-type flash memory chip.

10. The memory card of claim 1, wherein the semiconductor package is attached to the cavity by a liquid adhesive.

11. The memory card of claim 1, wherein the one or more memory chips and the circuit wirings are electrically connected by a metal wire, a TAB tape, or an anisotropic conductive film (ACF).

12. The memory card of claim 1, wherein the molding resin layer is asymmetrically formed such that the molding resin layer is biased to a first end portion of the package opposite to a second end portion of the package on which the external contact pads are formed.

13. The memory card of claim 1, wherein the molding resin layer includes a notch, the notch indenting into the molding resin layer horizontally from an edge of the molding resin layer and downwardly from a top surface of the molding resin layer.

14. The memory card of claim 1, wherein all of the external contacts pads are disposed in a single row on one end of the memory card.

15. The memory card of claim 1, further comprising a molding resin layer for sealing the memory chips.

16. A memory card, comprising:
a card base; and
a semiconductor package,
wherein the card base includes a first surface and a second surface, said first surface having a cavity formed thereon, and
wherein the semiconductor package comprises:
a substrate on which circuit wirings are formed on an inner surface thereof; and
a plurality of external contact pads formed on an outer surface of said substrate, the external contact pads electrically connected to the circuit wirings, one or more memory chips mounted on the inner surface of said substrate, and electrically connected to the circuit wirings, wherein the semiconductor package is mounted within the cavity so that the external contact pads are exposed, and substantially all of the external contacts pads being disposed in a single row on one end of the memory card.

* * * * *